(12) United States Patent
Mardian et al.

(10) Patent No.: US 6,743,736 B2
(45) Date of Patent: Jun. 1, 2004

(54) REACTIVE GASEOUS DEPOSITION PRECURSOR FEED APPARATUS

(75) Inventors: Allen P. Mardian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/121,341

(22) Filed: Apr. 11, 2002

(65) Prior Publication Data

US 2003/0194861 A1 Oct. 16, 2003

(51) Int. Cl.[7] .............................................. H01L 21/31
(52) U.S. Cl. ........................................ 438/758; 118/715
(58) Field of Search ................................ 118/715, 719; 137/1; 604/141; 438/758

(56) References Cited

U.S. PATENT DOCUMENTS

| | | | | |
|---|---|---|---|---|
| 4,296,920 A | * | 10/1981 | Miller et al. | 266/216 |
| 5,046,925 A | * | 9/1991 | Fletcher | 417/138 |
| 5,517,854 A | * | 5/1996 | Plumb et al. | 73/152.59 |
| 5,620,524 A | | 4/1997 | Fan et al. | |
| 5,730,801 A | * | 3/1998 | Iepman | 118/719 |
| 5,873,177 A | * | 2/1999 | Honda et al. | 34/58 |
| 5,879,461 A | * | 3/1999 | Adams | 118/724 |
| 6,079,867 A | * | 6/2000 | Fiorentini et al. | 366/159.1 |
| 6,230,501 B1 | * | 5/2001 | Bailey et al. | 62/51.1 |
| 6,240,943 B1 | * | 6/2001 | Smith | 137/1 |
| 6,355,561 B1 | | 3/2002 | Sandhu et al. | |
| 6,403,156 B2 | | 6/2002 | Jang et al. | |
| 6,419,462 B1 | | 7/2002 | Horie et al. | |
| 6,426,307 B2 | | 7/2002 | Lim | |
| 6,468,924 B2 | | 10/2002 | Lee et al. | |
| 6,482,262 B1 | | 11/2002 | Elers et al. | |
| 6,520,936 B1 | * | 2/2003 | Mann | 604/141 |
| 2001/0024387 A1 | | 9/2001 | Raaijmakers et al. | |
| 2001/0041250 A1 | | 11/2001 | Werkhoven et al. | |

OTHER PUBLICATIONS

U.S. patent application Ser. No. 10/163,689, Derderian et al., filed Jun. 5, 2002.
U.S. patent application Ser. No. 10/087,558, Dando et al., filed Feb. 28, 2002.

* cited by examiner

Primary Examiner—John F. Niebling
Assistant Examiner—Olivia Luk
(74) Attorney, Agent, or Firm—Wells St. John P.S.

(57) ABSTRACT

The invention includes reactive gaseous deposition precursor feed apparatus and chemical vapor deposition methods. In one implementation, a reactive gaseous deposition precursor feed apparatus includes a gas passageway having an inlet and an outlet. A variable volume accumulator reservoir is joined in fluid communication with the gas passageway. In one implementation, a chemical vapor deposition method includes positioning a semiconductor substrate within a deposition chamber. A first deposition precursor is fed to an inlet of a variable volume accumulator reservoir. With the first deposition precursor therein, volume of the variable volume accumulator reservoir is decreased effective to expel first deposition precursor therefrom into the chamber under conditions effective to deposit a layer on the substrate.

37 Claims, 5 Drawing Sheets

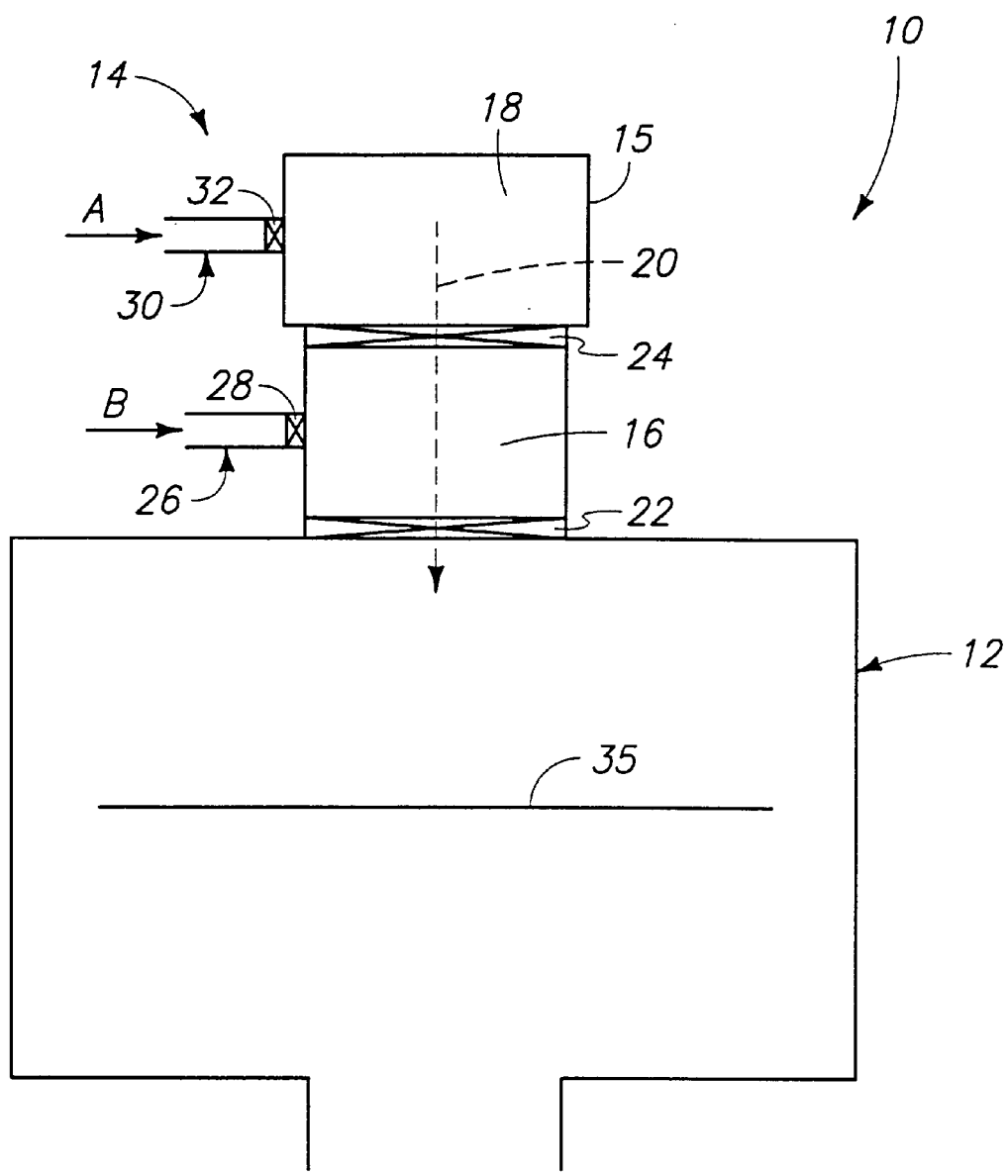

US 6,743,736 B2

REACTIVE GASEOUS DEPOSITION PRECURSOR FEED APPARATUS

TECHNICAL FIELD

This invention relates to reactive gaseous deposition precursor feed apparatus, and to chemical vapor deposition methods.

BACKGROUND OF THE INVENTION

Semiconductor processing in the fabrication of integrated circuitry typically includes the deposition of layers on semiconductor substrates. Exemplary processes include physical vapor deposition (PVD) and chemical vapor deposition (CVD). In the context of this document, "CVD" includes any process, whether existing or yet-to-be developed, where one or more vaporized chemicals is fed as a deposition precursor for reaction and adherence to a substrate surface. By way of example only, one such CVD process includes atomic layer deposition (ALD). With typical ALD, successive mono-atomic layers are adsorbed to a substrate and/or reacted with the outer layer on the substrate, typically by successive feeding of different precursors to the substrate surface.

Chemical vapor depositions can be conducted within chambers or reactors which retain a single substrate upon a wafer holder or susceptor. One or more precursor gasses are typically provided to a shower head within the chamber which is intended to uniformly provide the reactant gasses substantially homogeneously over the outer surface of the substrate. The precursors react or otherwise manifest in a deposition of a suitable layer atop the substrate. Plasma enhancement may or may not be utilized, and either directly within the chamber or remotely therefrom.

In certain chemical vapor deposition processes, including ALD, precursors are pulsed or otherwise intermittently injected into the reactor for adsorption onto a substrate or for reaction and/or deposition onto a substrate. In one prior art construction and method, a fixed volume chamber is provided with an in-feed end and with an out-feed end which feeds to a deposition chamber. A feed valve is upstream of the in-feed end, and an output valve is received between the out-feed end and the deposition chamber. A constant flow is provided to the reservoir through the in-feed valve and the output valved is periodically pulsed to provide pulsed flow to the chamber.

The invention was motivated in addressing the above-described issues, although it is in no way so limited. The invention is only limited by the accompanying claims as literally worded without interpretative or other limiting reference to the specification or drawings, and in accordance with the doctrine of equivalents.

SUMMARY

The invention includes reactive gaseous deposition precursor feed apparatus and chemical vapor deposition methods. In one implementation, a reactive gaseous deposition precursor feed apparatus includes a gas passageway having an inlet and an outlet. A variable volume accumulator reservoir is joined in fluid communication with the gas passageway. In one implementation, a chemical vapor deposition method includes positioning a semiconductor substrate within a deposition chamber. A first deposition precursor is fed to an inlet of a variable volume accumulator reservoir. With the first deposition precursor therein, volume of the variable volume accumulator reservoir is decreased effective to expel first deposition precursor therefrom into the chamber under conditions effective to deposit a layer on the substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
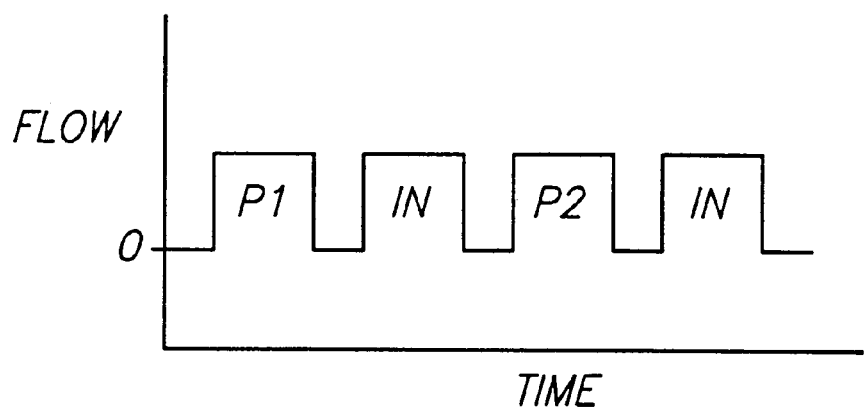
FIG. 1 is a diagrammatic depiction of a reactive gaseous deposition precursor feed apparatus in accordance with an aspect of the invention.

Referring to FIG. 1, an exemplary preferred embodiment reactive gaseous deposition precursor feed apparatus is indicated generally with reference 10. Such comprises a gas passageway 12 having an inlet 14 and an outlet 16. More inlets and outlets could be utilized, of course, with inlet 14 being configured for connection with a vaporized deposition precursor source, and outlet 16 being configured for connection with a deposition chamber. A variable volume accumulator reservoir 20 is joined in fluid communication with gas passageway 12. In the FIG. 1 preferred embodiment, an in-feed valve 22 is received in gas passageway 12 downstream of inlet 14, and an out-feed valve 24 is included in gas passageway 12 upstream of outlet 16. Variable volume accumulator reservoir 20 is joined in fluid communication with gas passageway 12 between in-feed valve 22 and out-feed valve 24.

Apparatus 10 includes a volume controlling moveable piston 26 received within variable volume accumulator reservoir 20. Such is diagrammatically depicted as having an actuator arm or shaft 28 extending therefrom. A spring 30 is shown received thereabout in engagement with piston 26 and an upper wall of accumulator reservoir 20 for spring biasing the piston towards a lowest volume state, which would be downwardly in the FIG. 1 depiction. Piston 26 might be pneumatically actuated, electric motor actuated, hydraulically actuated, or otherwise actuated with or without a spring bias. In the depicted embodiment, variable volume accumulator reservoir 20 is elongated in a direction generally transverse gas passageway 12 where the gas passageway joins with variable volume accumulator reservoir 20.

Variable volume accumulator reservoir 20 has a unitary inlet/outlet fluidic connection 34 with gas passageway 12.

Regardless, gas passageway 12 can be considered as having a first cross-sectional area 36 proximate where it joins with variable volume accumulator reservoir 20. Further, variable volume accumulator reservoir 20 can be considered as having a second cross-sectional area 38 where it joins with gas passageway 12. Such first and second cross-sectional areas can be the same or different in size. FIG. 1 depicts such cross-sectional areas being different in size, with second cross-sectional area 38 being smaller than first cross-sectional area 36. Of course, the reverse is also contemplated.

Figure 2:
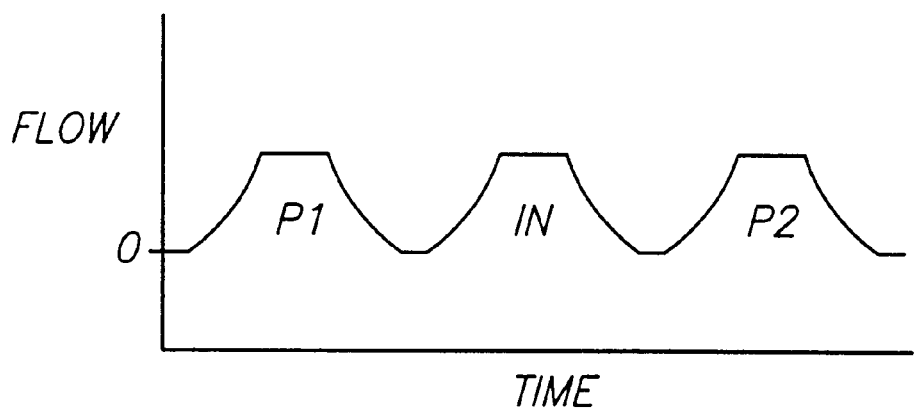
FIG. 2 is a diagrammatic depiction of another reactive gaseous deposition precursor feed apparatus in accordance with an aspect of the invention.

FIG. 2 illustrates an alternate embodiment reactive gaseous deposition precursor feed apparatus 10a. Like numerals from the first described embodiment are utilized where appropriate, with differences being indicated with the suffix "a" or with different numerals. Variable volume accumulator reservoir 20a of apparatus 10a can be considered as having opposing walls 40 which, at least in part, define a maximum cross-sectional area 42/38a of variable volume accumulator reservoir 20a. Opposing walls 40 join with gas passageway 12a to form a union therewith having said maximum cross-sectional area 42/38a. Variable volume accumulator reservoir 20a can also be considered as having an inlet 44 thereto and an outlet 46 therefrom which are different from one another, in contrast to, by way of example only, unitary inlet/outlet fluidic connection 34 of the first described embodiment.

Figure 3:
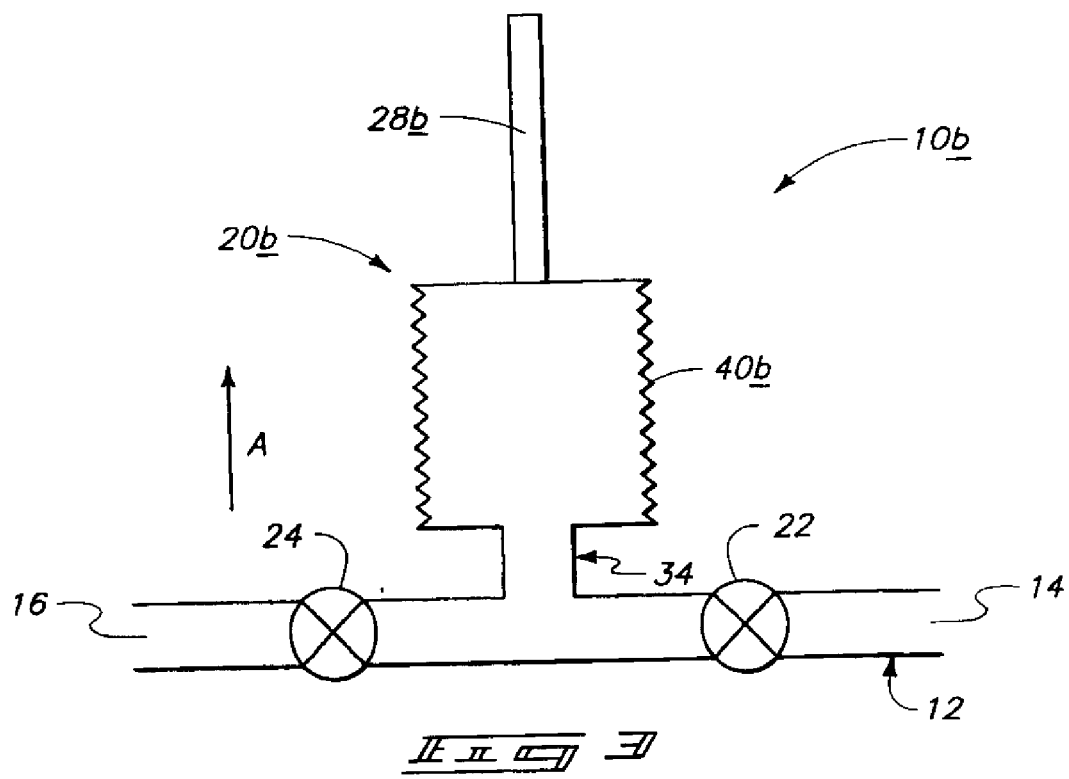
FIG. 3 is a diagrammatic depiction of yet another reactive gaseous deposition precursor feed apparatus in accordance with an aspect of the invention.
Figure 4:
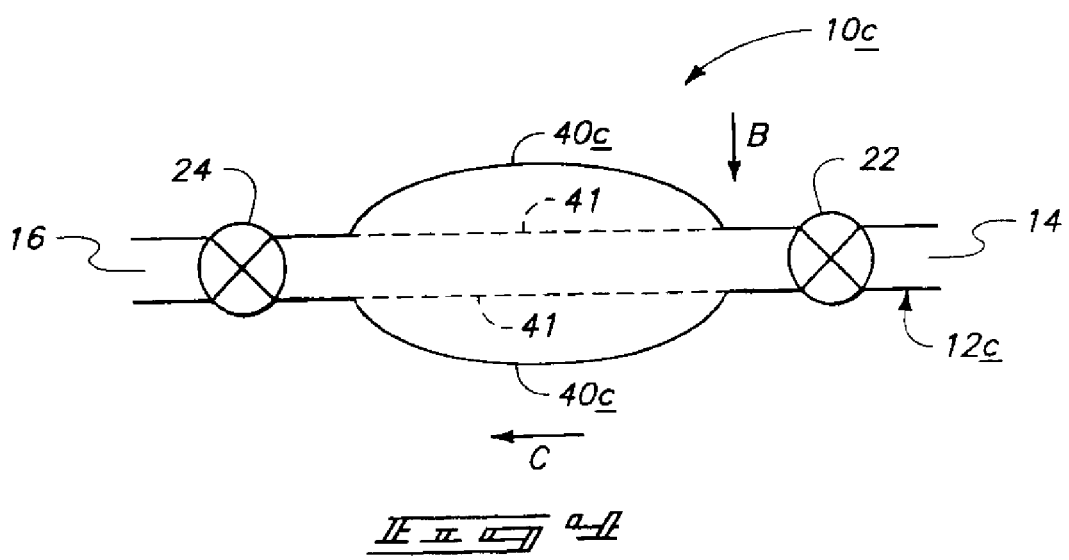

Further by way of example only, FIG. 3 illustrates another alternate embodiment reactive gaseous deposition precursor feed apparatus 10b. Like numerals from the first described embodiments are utilized where appropriate, with differences being indicated with the suffix "b" or with different numerals. Variable volume accumulator reservoir 20b of apparatus 10b comprises a bellows, for example having pleated walls 40b. An exemplary actuator arm/rod 28b extends therefrom for increasing and decreasing the volume within the reservoir of device 20b.

Figure 4:
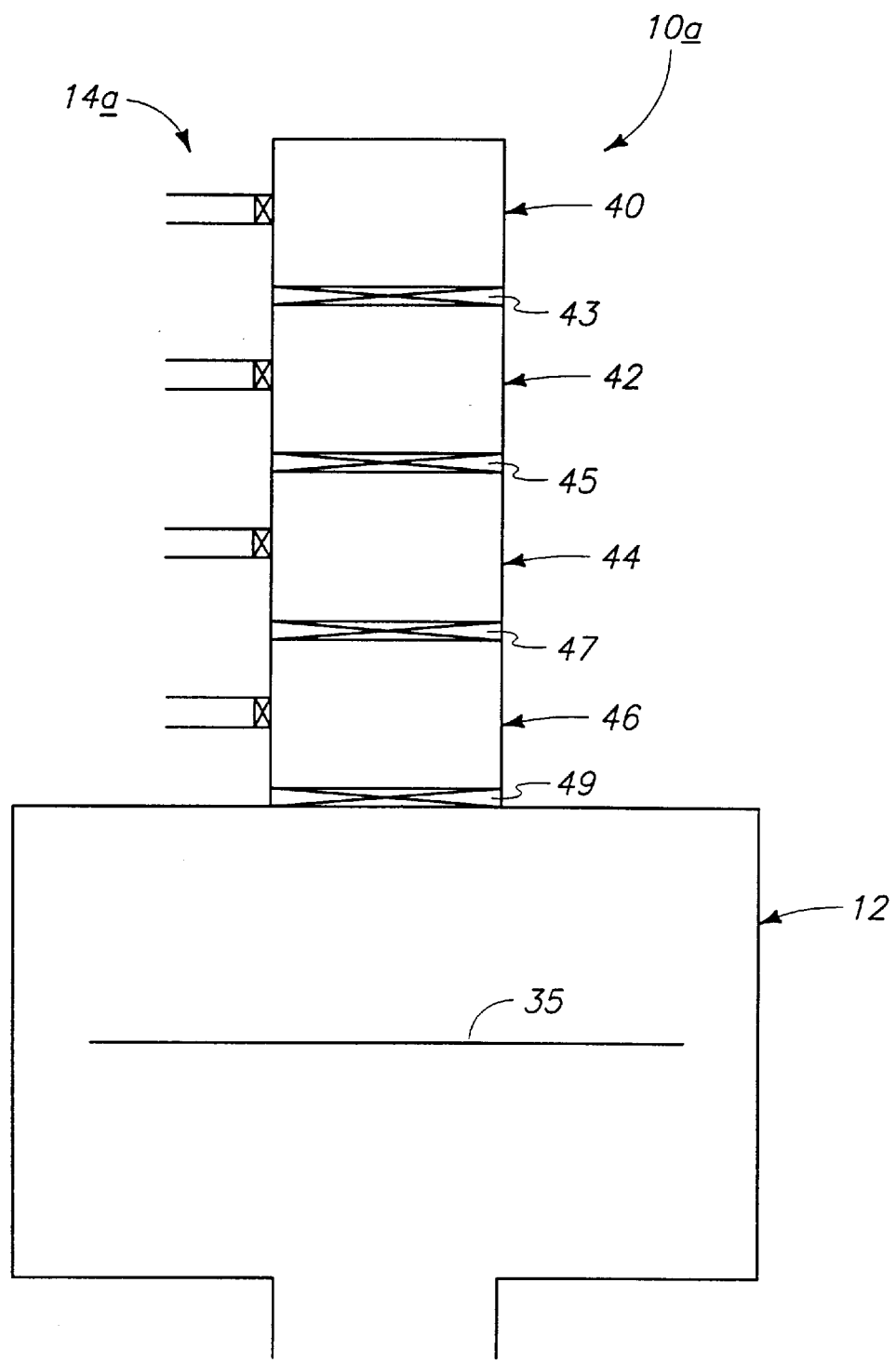
FIG. 4 is a diagrammatic depiction of still another reactive gaseous deposition precursor feed apparatus in accordance with an aspect of the invention.

FIG. 4 depicts yet another exemplary reactive gaseous deposition precursor feed apparatus 10c. Like numerals from the above-described embodiments are utilized where appropriate, with differences being indicated with the suffix "c" or with different numerals. Variable volume accumulator reservoir 20c of apparatus 10c comprises flexible elastic walls 40c formed in gas passageway 12c. Any suitable material (i.e., rubber, polymers, etc.) is contemplated for walls 40c whether existing or yet-to-be developed. FIG. 4 depicts walls 40c in an expanded, increased volume state as compared to a contracted state 41, indicated in phantom, in a direction B generally transverse a direction of flow C of the first deposition precursor when being expelled therefrom.

The invention contemplates a chemical vapor deposition method using the above-described apparatus, and methods independent thereof. The respective method claim families and apparatus claim families stand as literally worded, without reference to the other. In other words, the concluding apparatus claims are not limited by the method claims, nor are the concluding method claims limited by any attribute of the apparatus claims, unless literal language appears in such claims, and without any limiting or interpretative reference to the specification or drawings.

An exemplary first embodiment chemical vapor deposition method in accordance with the invention positions a semiconductor substrate within a deposition chamber. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 5:
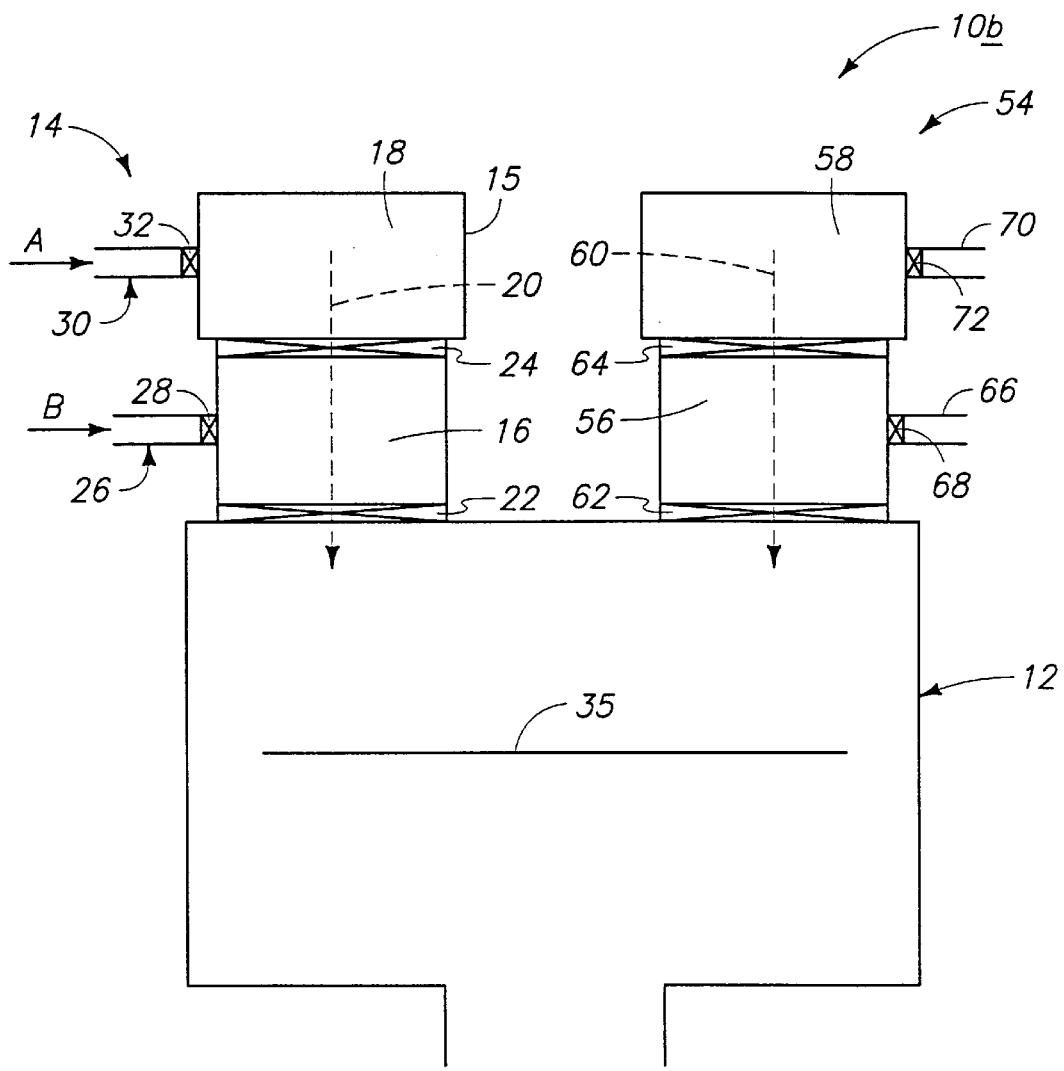
FIG. 5 is a view of the FIG. 1 apparatus in a different operational state than that depicted in FIG. 1.

A first deposition precursor is fed to an inlet of a variable volume accumulator reservoir. Such can occur through an inlet valve. The variable volume accumulator used in accordance with the method might comprise an outlet which is the same as the inlet, or an outlet which is different from the inlet. The feeding can comprise increasing the volume of the variable volume accumulator reservoir. For example, FIG. 5 illustrates the FIG. 1 apparatus 10 with piston 26 positioned to provide volume within variable volume accumulator reservoir 20 in one exemplary low volume state. Outlet valve 24 could be closed while inlet valve 22 is opened, and vaporized precursor caused to flow therethrough wherein the reservoir volume is increased to some quantity, for example as shown in FIG. 1. In such exemplary embodiment, such volume increasing occurs by forcing the in-feed precursor gas against moveable, spring-loaded piston 26. Alternately by way of example only, piston 26 could initially be positioned as shown in FIG. 1 during precursor feeding, and regardless of whether outlet valve 24 is fully opened, fully closed or positioned therebetween.

In one preferred embodiment, the method comprises maintaining pressure within the gas passageway proximate the inlet to the variable volume accumulator reservoir and pressure within the variable volume accumulator reservoir substantially constant during the feeding. One preferred reason for doing so may be to preclude condensing of precursor within the variable volume accumulator reservoir during the feeding. In one preferred embodiment, such maintaining can include sensing pressure within the variable volume accumulator reservoir during the feeding, and adjusting the rate of volume change of the variable volume accumulator reservoir during the feeding based upon the sensed pressure. Further by way of example only, the pressure within the accumulator might be maintained or controlled by controlling the motion of the volume reduction without sensing pressure.

With the first deposition precursor within the variable volume accumulator reservoir, the volume of the variable volume accumulator reservoir is decreased effective to expel the first deposition precursor therefrom into the chamber within which the semiconductor substrate is received under conditions effective to deposit a layer on the substrate. In one preferred embodiment, the inlet valve is closed and the outlet valve is opened immediately prior or during the volume decreasing. In one preferred embodiment, the decreasing of volume comprises moving a piston received within the variable volume accumulator reservoir. In one preferred embodiment, the decreasing comprises contracting a bellows. In one preferred embodiment, the decreasing comprises contracting flexible elastic walls in a direction generally transverse the direction of flow of the expelling first deposition precursor. In one preferred embodiment, the volume decreasing occurs at a substantially constant rate.

In one preferred embodiment, the method includes maintaining pressure within the gas passageway proximate the variable volume accumulator reservoir and pressure within the variable volume accumulator reservoir itself substantially constant during the volume decreasing. In one preferred embodiment, such can be accomplished by sensing pressure within the variable volume accumulator reservoir during the volume decreasing, and adjusting the rate of volume change of the variable volume accumulator reservoir during the decreasing based upon the sensed pressure. A most preferred chemical vapor deposition method in accordance with as aspect of the invention includes atomic layer deposition and depositing the layer as a monolayer, and forming successive monolayers (either the same or different) over the substrate.

Another preferred chemical vapor deposition method in accordance with an aspect of the invention positions a semiconductor substrate within a deposition chamber. A first deposition precursor is fed through an inlet valve to an inlet of a variable volume accumulator reservoir. An outlet valve from the variable volume accumulator reservoir is closed during the feeding. The feeding provides a first volume of the first deposition precursor within the variable volume accumulator reservoir at a first pressure.

After providing the first volume of the first deposition precursor with the variable volume accumulator reservoir at the first pressure, the inlet valve is closed. With the inlet and outlet valves closed, the first volume of the first deposition precursor within the variable volume accumulator reservoir is reduced effective to increase the pressure to a second pressure.

After the reducing, the outlet valve is opened and the volume of the variable volume accumulator reservoir decreased effective to expel first deposition precursor therefrom through the outlet valve at an outlet pressure exceeding the first pressure, and into the chamber under conditions effective to deposit a layer on the substrate. In one embodiment, the outlet pressure comprises the second pressure throughout a portion or all of the expelling. Any of the other above-described methodical aspects can be utilized in the just-described methods.

Figure 6:
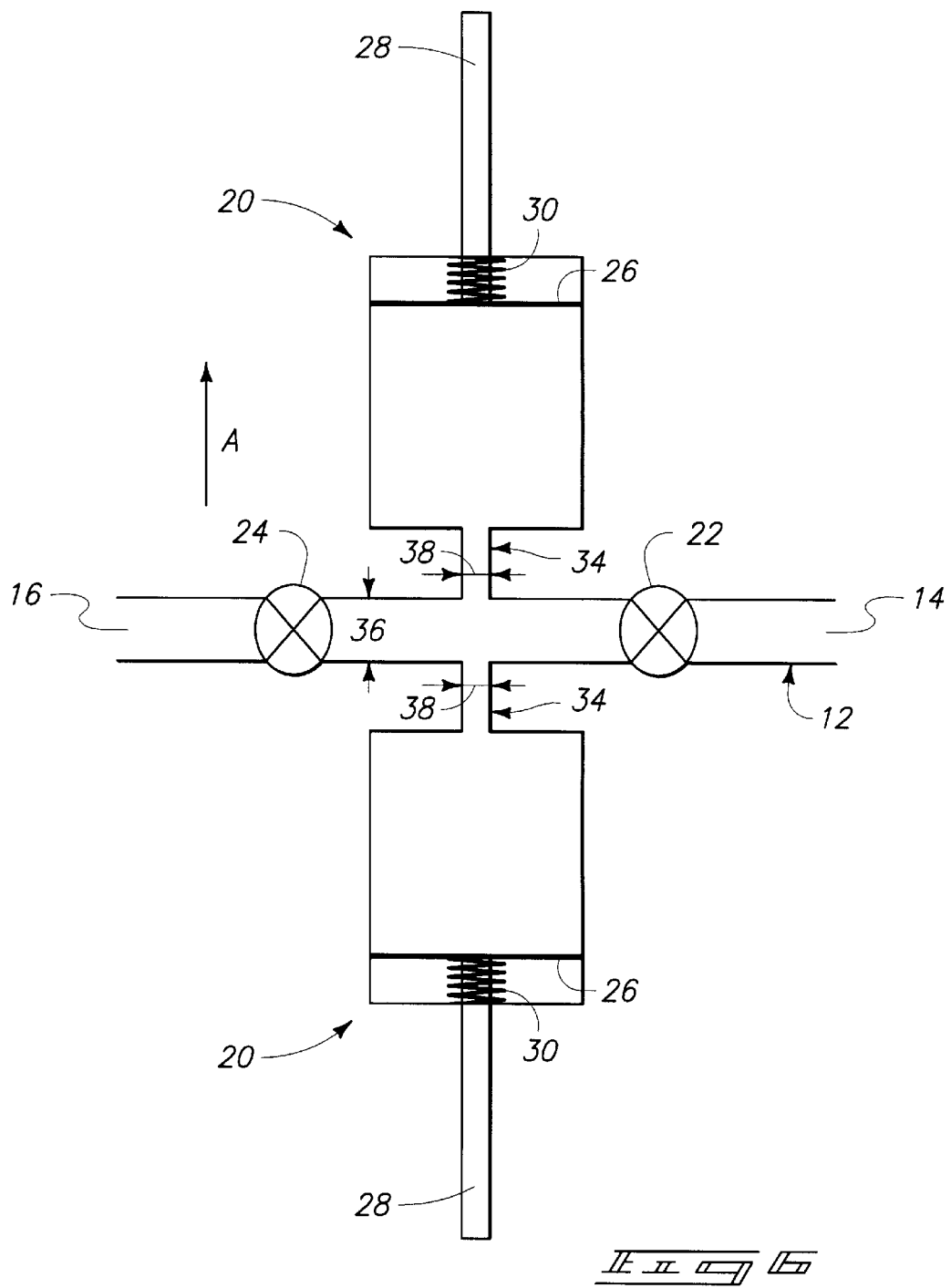
FIG. 6 is a diagrammatic depiction of another reactive gaseous deposition precursor feed apparatus in accordance with an aspect of the invention.

Multiple variable volume accumulator reservoirs might also be joined in fluid communication with the gas passageway, and otherwise utilized in accordance with methodical aspects of the invention. For example, FIG. 6 by way of example only shows two variable volume accumulator reservoirs 20.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

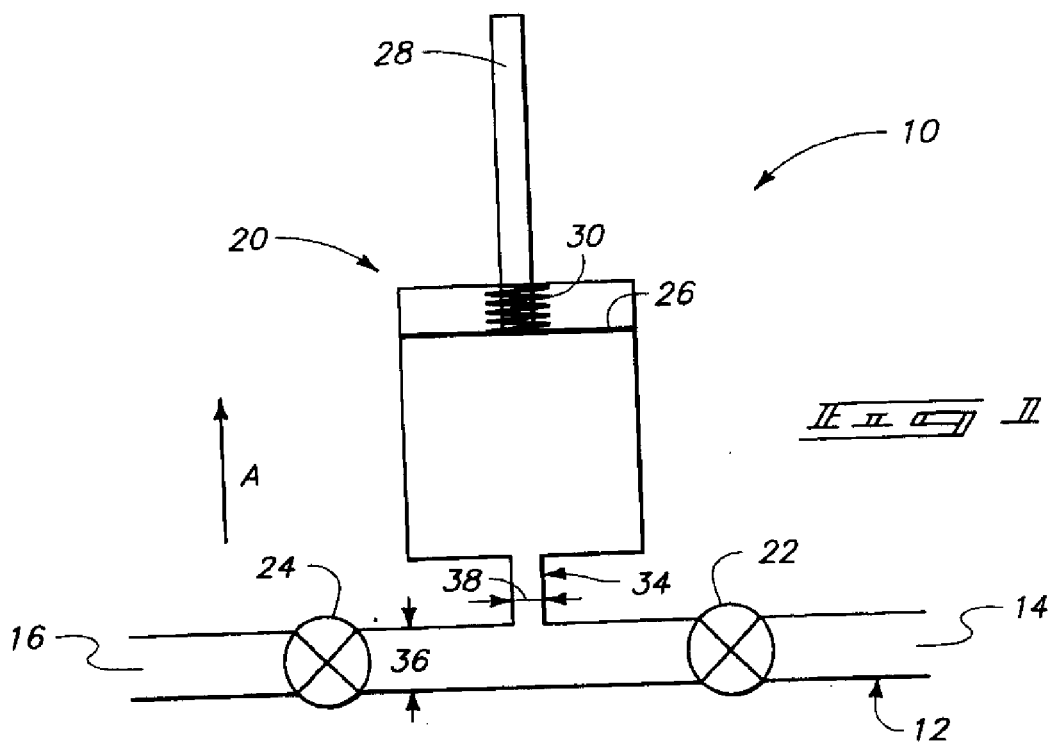
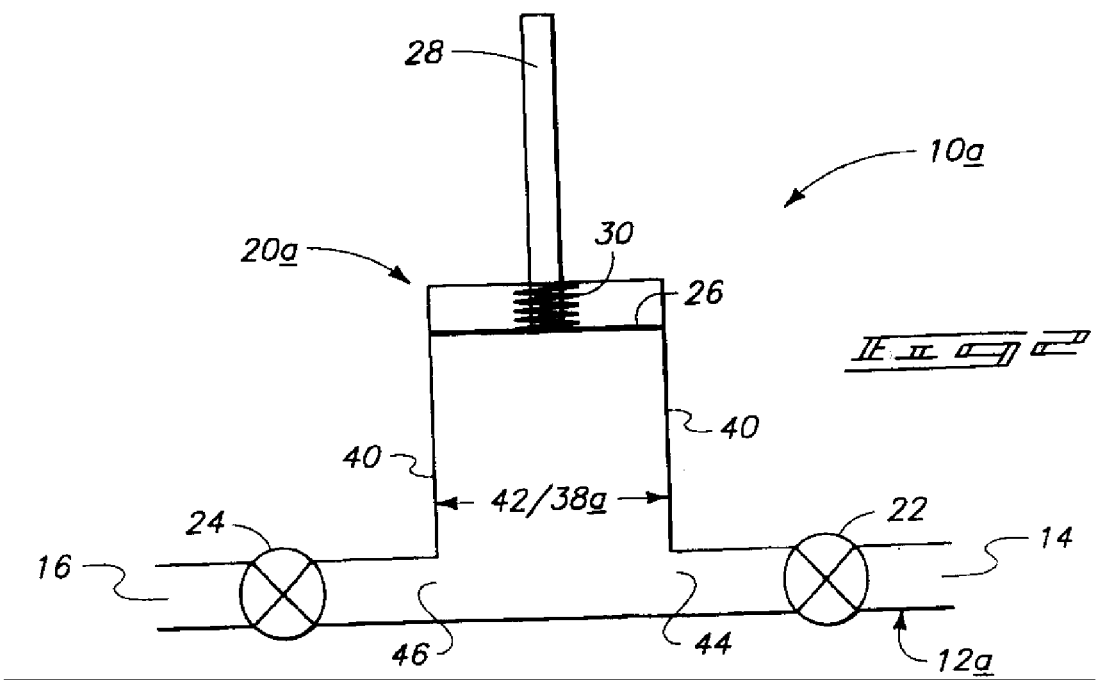

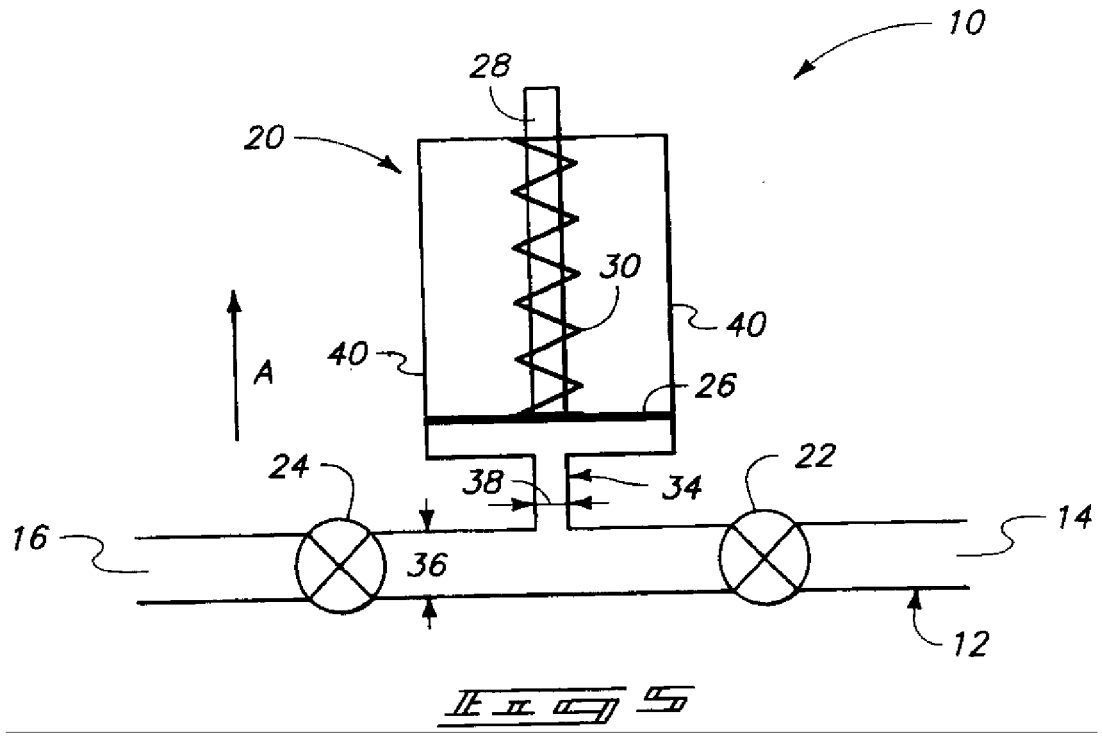

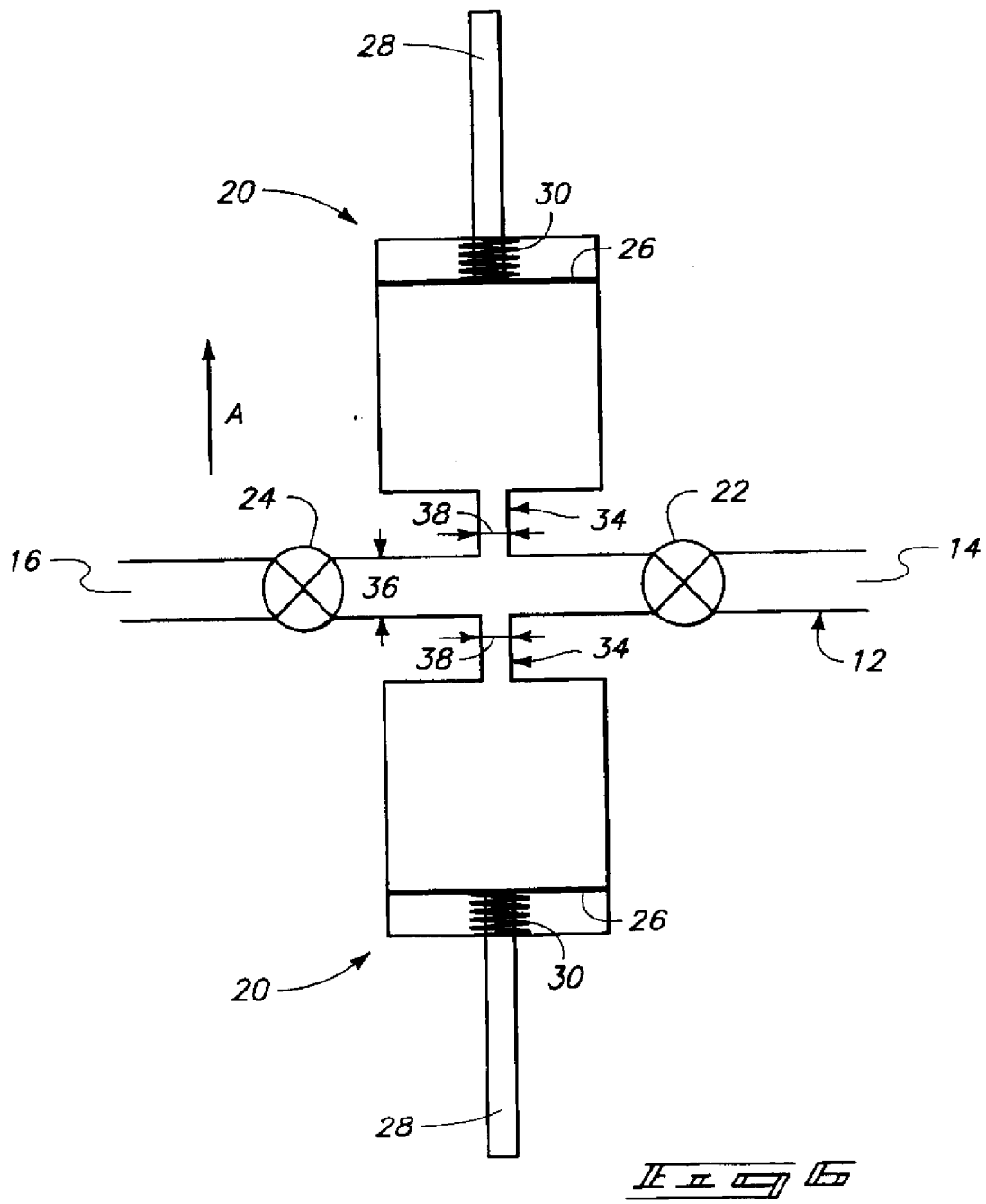

What is claimed is:

1. A reactive gaseous deposition precursor feed apparatus, comprising:
    a gas passageway having an inlet and an outlet; and
    a variable volume accumulator reservoir joined in fluid communication with the gas passageway, and comprising a pneumatically actuated, volume controlling movable piston within the variable volume accumulator reservoir.

2. A reactive gaseous deposition precursor feed apparatus, comprising:
    a gas passageway having an inlet and an outlet; and
    a variable volume accumulator reservoir joined in fluid communication with the gas passageway, and comprising an electric motor actuated, volume controlling movable piston within the variable volume accumulator reservoir.

3. A reactive gaseous deposition precursor feed apparatus, comprising:
    a gas passageway having an inlet and an outlet;
    a variable volume accumulator reservoir joined in fluid communication with the gas passageway; and
    an in-feed valve in the gas passageway downstream of the inlet and an out-feed valve in the gas passageway upstream of the outlet, the variable volume accumulator reservoir being in fluid communication with the gas passageway between the in-feed valve and the out-feed valve.

4. A reactive gaseous deposition precursor feed apparatus, comprising:
    a gas passageway having an inlet and an outlet;
    a variable volume accumulator reservoir joined in fluid communication with the gas passageway; and
    wherein the gas passageway has a first cross-sectional area proximate where it joins with the variable volume accumulator reservoir, and the variable volume accumulator reservoir has a second cross-sectional area where it joins with the gas passageway, the first and second cross-sectional areas being different in size.

5. The feed apparatus of claim 4 wherein the second cross-sectional area is larger than the first cross-sectional area.

6. The feed apparatus of claim 4 wherein the second cross-sectional area is smaller than the first cross-sectional area.

7. A reactive gaseous deposition precursor feed apparatus, comprising:
    a gas passageway having an inlet and an outlet;
    a variable volume accumulator reservoir joined in fluid communication with the gas passageway; and
    wherein the gas passageway has a first cross-sectional area proximate where it joins with the variable volume accumulator reservoir, and the variable volume accumulator reservoir has a second cross-sectional area where it joins with the gas passageway, the first and second cross-sectional areas being the same size.

8. A reactive gaseous deposition precursor feed apparatus, comprising:
    a gas passageway having an inlet and an outlet;
    a variable volume accumulator reservoir joined in fluid communication with the gas passageway; and
    wherein the variable volume accumulator has a unitary inlet/outlet fluidic connection with the gas passageway.

9. A reactive gaseous deposition precursor feed apparatus, comprising:
    a gas passageway having an inlet and an outlet;
    a variable volume accumulator reservoir joined in fluid communication with the gas passageway; and
    comprising multiple variable volume accumulator reservoirs joined in fluid communication with the gas passageway.

10. A reactive gaseous deposition precursor feed apparatus, comprising:
    a gas passageway having an inlet and an outlet;
    an in-feed valve in the gas passageway downstream of the inlet;
    an out-feed valve in the gas passageway upstream of the outlet; and
    a variable volume accumulator reservoir joined in fluid communication with the gas passageway between the in-feed valve and the out-feed valve, the variable volume accumulator reservoir being elongated in a direction generally transverse the gas passageway where the gas passageway joins with the variable volume accumulator reservoir.

11. The feed apparatus of claim 10 comprising a volume controlling movable piston within the variable volume accumulator reservoir.

12. The feed apparatus of claim 10 comprising a volume controlling movable piston within the variable volume accumulator reservoir, the piston being spring biased towards a lowest volume state.

13. The feed apparatus of claim 10 comprising a pneumatically actuated, volume controlling movable piston within the variable volume accumulator reservoir.

14. The feed apparatus of claim 10 comprising an electric motor actuated, volume controlling movable piston within the variable volume accumulator reservoir.

15. The feed apparatus of claim 10 wherein the variable volume accumulator reservoir comprises a bellows.

16. The feed apparatus of claim 10 wherein the gas passageway has a first cross-sectional area proximate where it joins with the variable volume accumulator reservoir, and the variable volume accumulator reservoir has a second cross-sectional area where it joins with the gas passageway, the first and second cross-sectional areas being different in size.

17. The feed apparatus of claim 16 wherein the second cross-sectional area is larger than the first cross-sectional area.

18. The feed apparatus of claim 16 wherein the second cross-sectional area is smaller than the first cross-sectional area.

19. The feed apparatus of claim 10 wherein the gas passageway has a first cross-sectional area proximate where it joins with the variable volume accumulator reservoir, and the variable volume accumulator reservoir has a second cross-sectional area where it joins with the gas passageway, the first and second cross-sectional areas being the same size.

20. The feed apparatus of claim 10 wherein the variable volume accumulator has a unitary inlet/outlet fluidic connection with the gas passageway.

21. The feed apparatus of claim 10 wherein the variable volume accumulator has an inlet thereto and an outlet therefrom which are different from one another.

22. The feed apparatus of claim 10 comprising multiple of said variable volume accumulator reservoirs joined in fluid communication with the gas passageway between the in-feed valve and the out-feed valve.

23. A reactive gaseous deposition precursor feed apparatus, comprising:
   a gas passageway having an inlet and an outlet; and
   a variable volume accumulator reservoir joined in fluid communication with the gas passageway, the variable volume accumulator reservoir being elongated in a direction generally transverse the gas passageway where the gas passageway joins with the variable volume accumulator reservoir, the variable volume accumulator reservoir comprising a movable piston configured to vary the volume of the variable volume accumulator reservoir.

24. The feed apparatus of claim 23 comprising an in-feed valve in the gas passageway downstream of the inlet and an out-feed valve in the gas passageway upstream of the outlet, the variable volume accumulator reservoir being in fluid communication with the gas passageway between the in-lead valve and the out-feed valve.

25. The feed apparatus of claim 23 wherein the gas passageway has a first cross-sectional area proximate where it joins with the variable volume accumulator reservoir, and the variable volume accumulator reservoir has a second cross-sectional area where it joins with the gas passageway, the first and second cross-sectional areas being different in size.

26. The feed apparatus of claim 25 wherein the second cross-section&1 area is larger than the first cross-sectional area.

27. The feed apparatus of claim 25 wherein the second cross-sectional area is smaller than the first cross-sectional area.

28. The feed apparatus of claim 23 wherein the gas passageway has a first cross-sectional area proximate where it joins with the variable volume accumulator reservoir, and the variable volume accumulator reservoir has a second cross-sectional area where it joins with the gas passageway, the first and second cross-sectional areas being the same size.

29. The feed apparatus of claim 23 wherein the variable volume accumulator has a unitary inlet/outlet fluidic connection with the gas passageway.

30. The feed apparatus of claim 23 wherein the variable volume accumulator has an inlet thereto and an outlet therefrom which are different from one another.

31. The feed apparatus of claim 23 comprising multiple of said variable volume accumulator reservoirs joined in fluid communication with the gas passageway.

32. A reactive gaseous deposition precursor feed apparatus, comprising:
   a gas passageway having an inlet and an outlet; and
   a variable volume accumulator reservoir joined in fluid communication with the gas passageway, the variable volume accumulator reservoir being elongated in a direction generally transverse the gas passageway where the gas passageway joins with the variable volume accumulator reservoir, the variable volume accumulator reservoir having opposing walls which at least in part define a maximum cross-sectional area of the variable volume accumulator reservoir, said opposing walls joining with the gas passageway to form a union therewith having said maximum cross-sectional area.

33. The feed apparatus of claim 32 comprising a volume controlling movable piston within the variable volume accumulator reservoir.

34. The feed apparatus of claim 32 comprising a volume controlling movable piston within the variable volume accumulator reservoir, the piston being spring biased towards a lowest volume state.

35. The feed apparatus of claim 32 comprising a pneumatically actuated, volume controlling movable piston within the variable volume accumulator reservoir.

36. The feed apparatus of claim 32 comprising an electric motor actuated, volume controlling movable piston within the variable volume accumulator reservoir.

37. The feed apparatus of claim 32 comprising
   an in-feed valve in the gas passageway downstream of the inlet and an out-feed valve in the gas passageway upstream of the outlet, the variable volume accumulator reservoir being in fluid communication with the gas passageway between the in-feed valve and the out-feed valve.

* * * * *

UNITED STATES PATENT AND TRADEMARK OFFICE
CERTIFICATE OF CORRECTION

PATENT NO. : 6,743,736 B2
DATED : June 1, 2004
INVENTOR(S) : Mardian et al.

It is certified that error appears in the above-identified patent and that said Letters Patent is hereby corrected as shown below:

Title page,
Item [56], References Cited, U.S. PATENT DOCUMENTS, please insert the following:

-- 4,036,170     07/19/77 Goodheim
   4,263,091     04/21/81 King
   4,689,094     08/25/87 Van Rees et al.
   4,761,269     08/02/88 Conger et al.
   4,989,637     02/05/91 Dittrich
   5,200;388     04/06/93 Abe et al.
   5,254,210     10/19/93 Jones et al.
   5,316,579     05/31/94 McMillan et al.
   5,765,585     06/16/98 Peterson
   6,200,387 B1  03/13/01 Ni
   6,185,839  *  02/2001 Kholodenko et al.
   6,245,151  *  06/2001 Bhandari et al.
   2002/0192369 A1    12/19/02    Morimoto et al. --

Drawings,
Sheets 1-4, should be replaced with the attached sheets

Column 7,
Line 67, please delete "in-lead" before "value" and insert -- feed --.

Column 8,
Line 9, please delete "cross-section&1" before "area" and insert -- cross-sectional --.

Signed and Sealed this

Fifth Day of April, 2005

JON W. DUDAS
*Director of the United States Patent and Trademark Office*